US012700565B2

(12) United States Patent
McLaughlin et al.

(10) Patent No.: US 12,700,565 B2
(45) Date of Patent: Aug. 4, 2026

(54) ACTIVELY COOLED GAS LINE FOR ION SOURCE

(71) Applicant: Applied Materials, Inc., Santa Clara, CA (US)

(72) Inventors: Adam M. McLaughlin, Merrimac, MA (US); Graham Wright, Newburyport, MA (US); Mateo Navarro Goldaraz, Cambridge, MA (US)

(73) Assignee: Applied Materials, Inc., Santa Clara, CA (US)

( * ) Notice: Subject to any disclaimer, the term of this patent is extended or adjusted under 35 U.S.C. 154(b) by 529 days.

(21) Appl. No.: 18/128,033

(22) Filed: Mar. 29, 2023

(65) Prior Publication Data

US 2024/0331972 A1     Oct. 3, 2024

(51) Int. Cl.
*H01J 37/30*         (2006.01)
*H01J 37/317*        (2006.01)

(52) U.S. Cl.
CPC ...... *H01J 37/3002* (2013.01); *H01J 37/3171* (2013.01); *H01J 2237/002* (2013.01); *H01J 2237/31701* (2013.01)

(58) Field of Classification Search
CPC ............... H01J 37/3002; H01J 37/3171; H01J 2237/002; H01J 2237/31701
See application file for complete search history.

(56) References Cited

U.S. PATENT DOCUMENTS 1,852,490  A  *  4/1932  Sullivan .................... F28D 7/14
                                                        165/145
8,162,034  B2 *  4/2012  Bonner ..................... F28D 1/06
                                                        165/906

9,111,860  B2     8/2015  Jones et al.
10,892,136  B2    1/2021  Chaney et al.
2009/0071406  A1*  3/2009  Choi ..................... C03C 17/002
                                                        118/724
2011/0240877  A1*  10/2011  Benveniste ......... H01J 37/3171
                                                        250/424
2012/0252195  A1*  10/2012  Jones ..................... H01J 37/08
                                                        257/E21.334

(Continued)

FOREIGN PATENT DOCUMENTS

KR     10-2006-0030755  A     4/2006
WO       2011/056515  A2     5/2011

OTHER PUBLICATIONS

International Search Report and Written Opinion mailed Jul. 1, 2024 in corresponding PCT application No. PCT/US2024/018522.

*Primary Examiner* — David E Smith
(74) *Attorney, Agent, or Firm* — Nields, Lemack & Frame, LLC

(57)          ABSTRACT

An actively cooled gas conduit for use with an ion source is disclosed. The gas conduit includes a gas channel and a cooling channel that may be adjacent to one another for at least a portion of the length of the gas channel. The gas conduit may be constructed by bonding two or more tubes together. Alternatively, the gas conduit may be constructed using additive manufacturing such that the cooling channel and the gas channel are within the same gas conduit. In some embodiments, the return channel is also disposed in the gas conduit. By actively cooling the gas conduit, the temperature of the gas conduit may be lowered, which reducing the possibility of clogging due to decomposition of the feed gas.

14 Claims, 10 Drawing Sheets

(56)         References Cited

U.S. PATENT DOCUMENTS

| | | | |
|---|---|---|---|
| 2014/0145581 A1* | 5/2014 | Jerez | H01J 27/08 |
| | | | 313/231.41 |
| 2019/0237290 A1 | 8/2019 | Yuze et al. | |
| 2020/0051773 A1 | 2/2020 | Chaney et al. | |

* cited by examiner

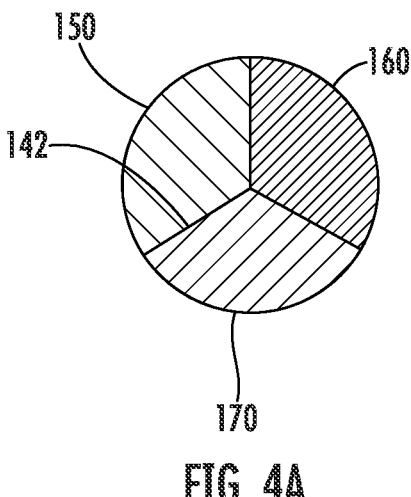
FIG. 4A
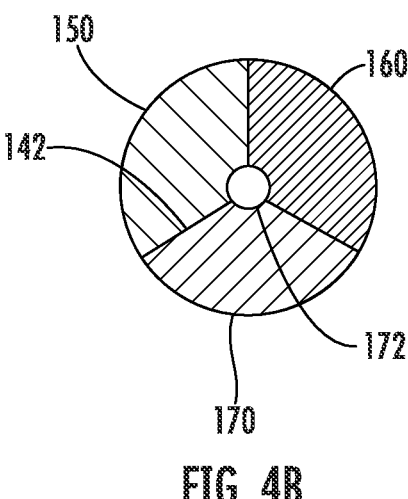
FIG. 4B
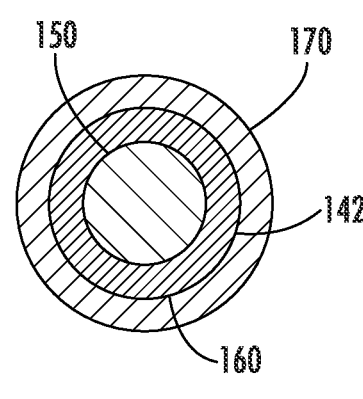
FIG. 4C
FIG. 4D

ACTIVELY COOLED GAS LINE FOR ION SOURCE

FIELD

Embodiments of the present disclosure relate to systems for cooling a gas line that is in communication with an ion source.

BACKGROUND

Ion sources are used to produce ions that may then be used to process a workpiece, such as a silicon wafer. In some embodiments, the ions are extracted from the ion source and energized to form an ion beam that is implanted into the workpiece.

One such ion source is an indirectly heated cathode ion source. An indirectly heated cathode (IHC) ion source operates by supplying a current to a filament disposed behind a cathode. The filament emits thermionic electrons, which are accelerated toward and heat the cathode, in turn causing the cathode to emit electrons into the arc chamber of the ion source. The cathode is disposed at one end of an arc chamber. A repeller may be disposed on the end of the arc chamber opposite the cathode. The cathode and repeller may be biased so as to repel the electrons, directing them back toward the center of the arc chamber. In some embodiments, a magnetic field is used to further confine the electrons within the arc chamber. A plurality of sides is used to connect the two ends of the arc chamber.

An extraction aperture is disposed along one of these sides, proximate the center of the arc chamber, through which the ions created in the arc chamber may be extracted.

A feed gas is supplied to the ion source, using a gas line. The gas line may have an inlet in atmospheric conditions, while its output is at the ion source. As the gas line travels to the ion source, it may be heated due to the elevated temperature of the ion source. A gas bushing may be used to thermally isolate the gas line from the ion source; however, some heat is still transferred to the gas tube. Further, certain feed gasses may decompose at higher temperatures, potentially causing clogging in the gas line, and shortening the life of the assembly.

Therefore, it would be beneficial if there was a system to cool the gas line so the feed gas in the gas tube remains below the temperature at which decomposition occurs.

SUMMARY

An actively cooled gas conduit for use with an ion source is disclosed. The gas conduit includes a gas channel and a cooling channel that may be adjacent to one another for at least a portion of the length of the gas channel. The gas conduit may be constructed by bonding two or more tubes together. Alternatively, the gas conduit may be constructed using additive manufacturing such that the cooling channel and the gas channel are within the same gas conduit. In some embodiments, the return channel is also disposed in the gas conduit. By actively cooling the gas conduit, the temperature of the gas conduit may be lowered, which reducing the possibility of clogging due to decomposition of the feed gas.

According to one embodiment, an ion implantation system is disclosed. The ion implantation system comprises an ion source; a gas bushing in communication with an interior of the ion source, wherein the ion source and the gas bushing are located in a vacuum chamber; a vacuum flange to separate the vacuum chamber from an atmospheric environment; and a gas conduit in communication with the gas bushing, comprising a gas channel having an inlet located in the atmospheric environment and an outlet in communication with the gas bushing; a cooling channel adjacent to the gas channel; and a return channel, in fluid communication with the cooling channel; wherein the cooling channel abuts the gas channel along at least 50% of a length of the gas channel between the vacuum flange and the outlet. In some embodiments, the cooling channel abuts the gas channel as it passes through the vacuum flange. In some embodiments, the gas channel and the cooling channel are separate tubes that are bonded together. In certain embodiments, the return channel is a separate tube that is bonded to the gas channel and the cooling channel. In some embodiments, the system comprises a block of material, wherein the cooling channel and the gas channel are created by gun drilled bores in the block of material. In certain embodiments, the return channel is created by a gun drilled bore in the block of material. In some embodiments, the cooling channel, the return channel and the gas channel are all disposed in one conduit, and interior walls are used to separate the channels. In certain embodiments, the cooling channel, the return channel and the gas channel extend linearly through a length of the one conduit. In certain embodiments, the cooling channel, the return channel and the gas channel spiral though a length of the one conduit.

According to another embodiment, an ion implantation system is disclosed. The ion implantation system comprises an ion source; a base on which the ion source is disposed; and a gas conduit in communication with the ion source, wherein a portion of the gas conduit passes through the base prior to entering the ion source. In some embodiments, the gas conduit enters the ion source through a surface adjacent to the base. In certain embodiments, the gas conduit comprises a gas channel, a cooling channel and a return channel. In some embodiments, the system comprises a gas bushing in communication with the ion source, wherein the gas conduit exits the base and is affixed to a first end of a bushing conduit in the gas bushing.

According to another embodiment, an ion implantation system is disclosed. The ion implantation system comprises an ion source; a base on which the ion source is disposed, the base including base cooling channels, the base having two openings in communication with the base cooling channels; a gas bushing in communication with an interior of the ion source, the gas bushing comprising a bushing conduit for carrying feed gas to the ion source; and a gas conduit in communication with a first end of the bushing conduit; wherein fluid passing through the base cooling channels cools the bushing conduit. In some embodiments, a cooling loop is in communication with the two openings in the base, wherein the cooling loop is pressed against the gas bushing. In some embodiments, the gas bushing comprises a cooling loop that is parallel to the bushing conduit for at least a portion of its length, wherein the cooling loop is in communication with the two openings in the base.

BRIEF DESCRIPTION OF THE FIGURES

For a better understanding of the present disclosure, reference is made to the accompanying drawings, which are incorporated herein by reference and in which:

FIGS. 4A-4D show four cross-sections of the gas conduit of FIGS. 3A-3B;

DETAILED DESCRIPTION

Figure 1:
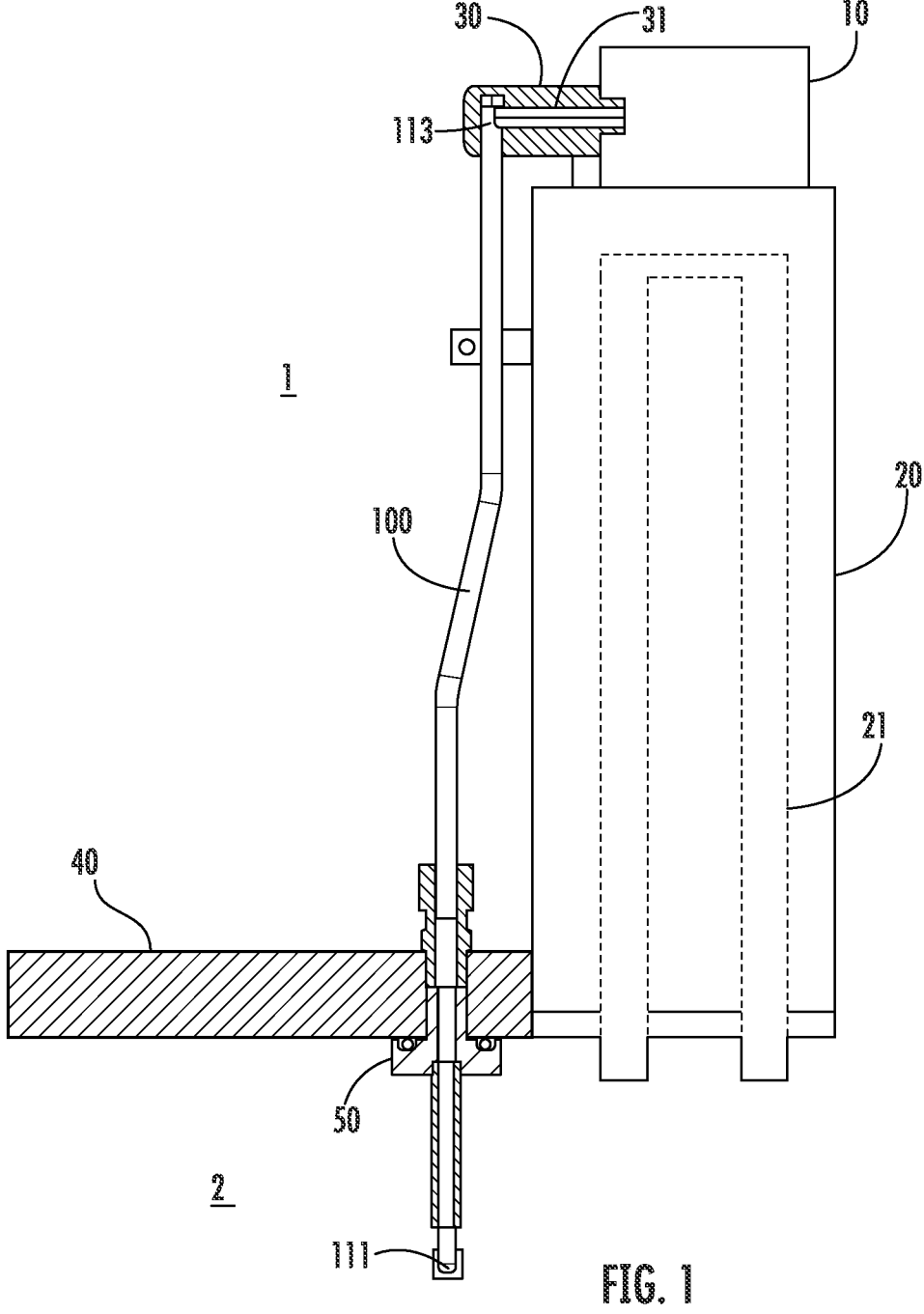
FIG. 1 shows a portion of an ion implantation system, including an ion source mounted on a base with a gas conduit.

As described above, a gas line is typically used to supply a feed gas to an ion source. FIG. 1 shows a portion of an ion implantation system that includes an ion source 10. The configuration also includes a gas conduit 100 in fluid communication with the ion source 10. In many configurations, the ion source 10 is mounted on a base 20, which typically serves as a heat sink. In some embodiments, base cooling channels 21 may be disposed in the base 20, wherein a cooling fluid passes through the base cooling channels 21 to remove heat from the base 20. The connections to the base cooling channels 21 may be disposed in an atmospheric environment 2, outside of the vacuum chamber 1.

Additionally, a gas conduit 100 extends from the atmospheric environment 2 to a gas bushing 30. The inlet to the gas conduit 100 may be attached to a gas canister and is located in the atmospheric environment 2. The outlet of the gas conduit 100 is at the gas bushing 30 in the vacuum chamber 1. The gas bushing 30 includes a bushing conduit 31, which serves to create fluid communication between the ion source 10 and the gas conduit 100. The gas bushing 30 enters an opening located in one surface of the ion source 10, wherein that surface is not adjacent to the base 20. In some embodiments, the gas bushing 30 may be a ceramic material to reduce thermal conductivity from the ion source 10 to the gas conduit 100. In other embodiments, the gas bushing 30 may be metal, such as stainless steel, tantalum or others. The gas conduit 100 is attached to the first end of the bushing conduit 31, while the second end of the bushing conduit 31 is disposed at the ion source 10.

An exterior wall 40 is used to separate the vacuum chamber 1 from the atmospheric environment 2. The gas conduit 100 passes through the exterior wall 40 and extends to the ion source 10. A vacuum flange 50 is used to retain the pressure differential between the vacuum chamber 1 and the atmospheric environment 2.

In the embodiments shown in FIGS. 1-6B, the gas conduit 100 comprises a gas channel, a cooling channel and a return channel. In these embodiments, the cooling channel is adjacent to the gas channel and is parallel to the gas channel for at least a portion of the path from the vacuum flange 50 to the gas bushing 30. In some embodiments, the cooling channel abuts the gas channel as the gas channel passes through the vacuum flange 50. In some embodiments, the cooling channel extends from the vacuum flange 50 toward the gas bushing 30, terminating at or near the gas bushing 30. In some embodiments, the cooling channel terminates less than 6 inches from the gas bushing 30. In other embodiments, the cooling channel terminates less than 4 inches from the gas bushing 30. In yet other embodiments, the cooling channel may terminate within 2 inches of the gas bushing 30. In some embodiments, the cooling channel is parallel to the gas channel over a distance of at least 6 inches. In some embodiments, the return channel also abuts the gas channel and is parallel to the gas channel. In some embodiments, the cooling channel abuts the gas channel for at least 50% of the length from the vacuum flange 50 to the gas bushing 30.

In operation, the cooling channel is in communication with a source of coolant fluid, which may be water, a cooled gas, or another suitable fluid. The coolant fluid enters the inlet of the cooling channel, which is in the atmospheric environment 2, passes through the cooling channel, passes through a junction into the return channel and exits through the outlet of the return channel, which is also in the atmospheric environment 2. The gas channel may be used to transport a feed gas to the ion source 10. The feed gas may be any suitable gas, such as a boron containing gas, a phosphorus containing gas, an arsenic containing gas, an aluminum containing gas, hydrogen, or an inert gas.

Figure 2A:
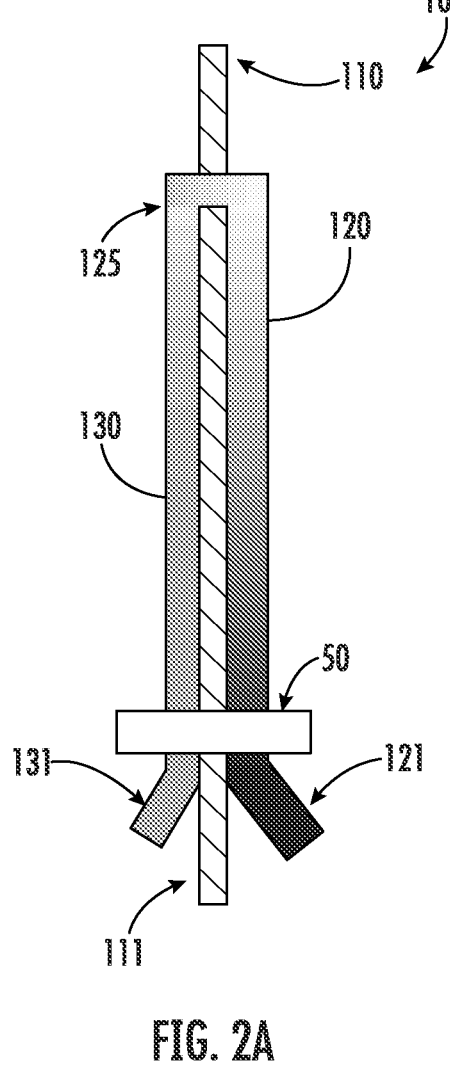
FIGS. 2A-2B show two embodiments of a gas conduit that actively cools the feed gas.
Figure 2B:
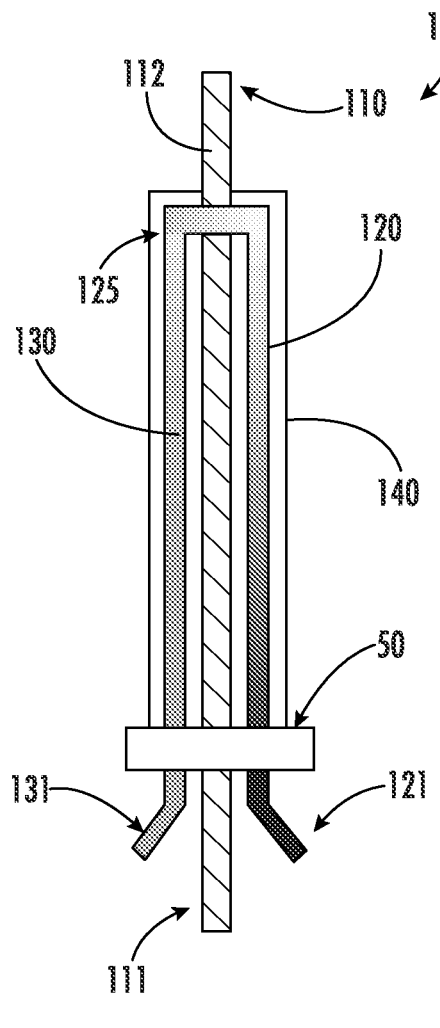

The embodiments shown in FIGS. 2A-2B may be created using traditional manufacturing techniques. FIG. 2A shows a first embodiment of a gas conduit 100. In this embodiment, the gas conduit 100 comprises three tubes that are welded or otherwise bonded together. Thus, in this embodiment, the gas channel 110, the cooling channel 120 and the return channel 130 are each separate tubes that are bonded together. For example, these tubes may be stainless steel, nickel, tantalum or another metal. In some embodiments, the outer diameter of the tubes is between 0.250 inches and 0.375 inches, with a wall thickness of between 0.02 inches and 0.035 inches. The inner diameter of the tubes may be 0.20 inches to 0.35 inches. The inlet 111 to the gas channel 110 is disposed in the atmospheric environment 2, outside the vacuum flange 50. The outlet 113 of the gas channel 110 attaches to the first end of the bushing conduit 31 in the gas bushing 30 (see FIG. 1). Before reaching the gas bushing 30, the outlet of the cooling channel 120 is attached to the inlet of the return channel 130, such as at junction 125. The cooling inlet 121 and the return outlet 131 are both located in atmospheric environment 2. Thus, there are no seals or other fluid connections that are made in the vacuum chamber 1, except the connection of the gas channel 110 to the first end of the bushing conduit 31 in the gas bushing 30.

FIG. 2B shows a second embodiment. In this embodiment, a block of material 140, which may be a metal, such as stainless steel, nickel or tantalum, or a ceramic, is gun drilled to create three bores that pass through the entirety of the block of material 140. These bores serve as the gas channel 110, the cooling channel 120 and the return channel 130. The bores may be between 0.20 and 0.305 inches in diameter, and may be spaced apart by between 0.02 and 0.05 inches. The inlet 111 to the gas channel 110 is disposed in the atmospheric environment 2, outside the vacuum flange 50. The cooling channel 120 and the return channel 130 may be connected at junction 125 within the block of material 140 to form a loop. As noted above, the cooling inlet 121 and the return outlet 131 are both located in atmospheric environment 2. In this embodiment, the gas channel 110 extends beyond the block of material 140. This may be achieved by passing a tube 112 through the bore associated with the gas channel, wherein the tube 112 is longer than the length of the block of material 140. Alternatively, a tube 112 may be affixed to the distal end of the block of material 140. Note that FIG. 2B shows the block of material 140 extending to the vacuum flange 50; however, in other embodiments, the block of material 140 may not extend to the vacuum flange 50. Because of the gun drilled bores, the cooling channel 120 and the gas channel 110 are parallel to one another through at least a portion of the path from the vacuum flange 50 to the gas bushing 30.

While FIGS. 2A-2B show embodiments that may be created using traditional manufacturing techniques, additive manufacturing allows other embodiments to be created.

Figure 3A:
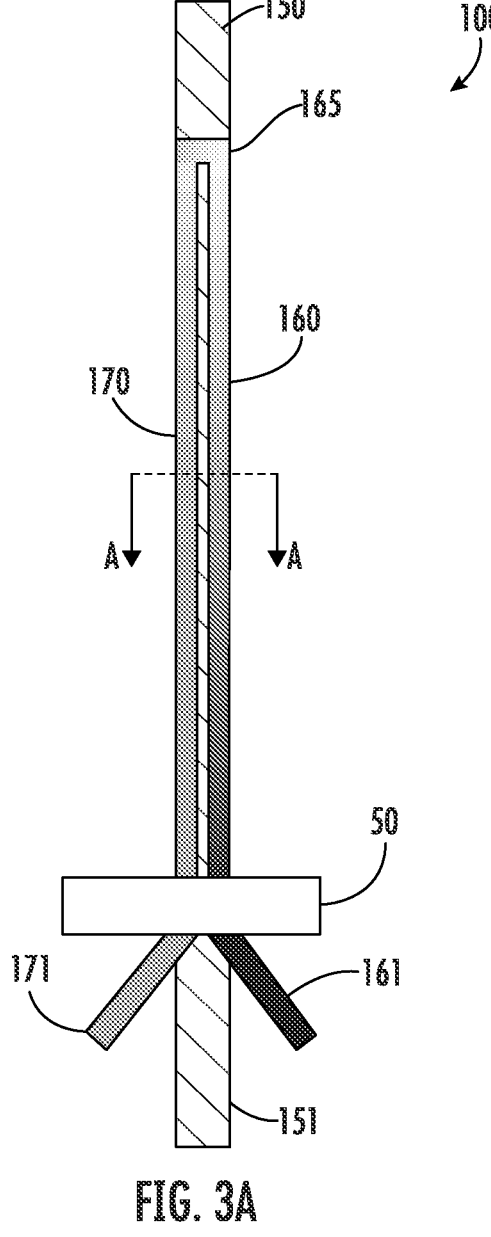
FIGS. 3A-3B shows a gas conduit made using additive manufacturing according to two embodiments.
Figure 3B:
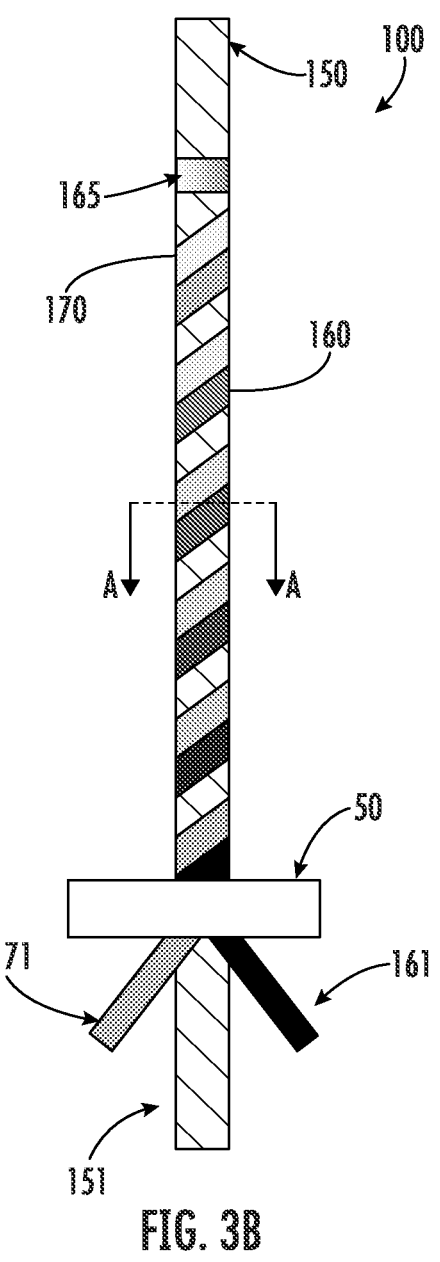

FIG. 3A shows a gas conduit 100 that may be formed using additive manufacturing according to a first embodiment. In this embodiment, gas conduit 100 may be stainless steel, nickel, tantalum or another metal. Alternatively, gas conduit 100 may be a nonporous ceramic material that does not interact with the feed gas. Additionally, the cross-section of the gas conduit 100 includes the gas channel 150, the cooling channel 160 and the return channel 170. The combined cross-sectional area of these channels may be similar to the combined cross-sectional area of the separate tubes described above in FIG. 2A. In some embodiments, the combined cross-sectional area may be between 0.09 in$^2$ and 0.3 in$^2$. These three channels extend linearly through the length of the gas conduit 100. As noted above, the inlet 151 to the gas channel 150 may be disposed in the atmospheric environment 2. At a junction 165 before the gas bushing 30, the cooling channel 160 and the return channel 170 are connected so that fluid travels through the cooling inlet 161 in the cooling channel 160, enters the return channel 170 and exits through the return outlet 171. FIG. 3B shows a gas conduit 100 that may be formed using additive manufacturing according second to a embodiment. Like the embodiment of FIG. 3A, the gas conduit 100 includes three channels. However, the three channels spiral through the length of the gas conduit 100. As described above, there is a junction 165, where the cooling channel 160 and the return channel 170 are connected so that fluid travels through the cooling channel 160, enters the return channel 170 and exits through the return outlet 171.

FIGS. 4A-4D show different cross-sections, taken along plane A-A, that may be associated with the gas conduits 100 shown in FIGS. 3A-3B. While these figures show the gas conduit 100 as being cylindrical, other shapes are also possible. In FIG. 4A, the three channels (gas channel 150, cooling channel 160 and return channel 170) each occupy a wedge within the gas conduit 100. In this embodiment, three interior walls 142 are disposed within the gas conduit 100 and each interior wall 142 extends inward from the inner wall of gas conduit 100 and meet at a common point within the gas conduit 100. The interior walls 142 may have a thickness of 0.2 to 0.4 inches, although other dimensions may be used. While the wedges are shown being equal sizes, it is understood that the cross-sectional area of each channel may be different if desired. Additionally, the common point does not have to be at the center of the cross-section. Further, in other embodiments, the three interior walls 142 may not meet at a common point; rather each may extend across the gas conduit 100 and be attached to the inside wall of the gas conduit 100 at two points.

FIG. 4B shows an embodiment similar to FIG. 4A, where an internal leakage monitoring conduit 172 is disposed near the center of the gas conduit 100. The internal leakage monitoring conduit 172 may have an inner diameter of 0.05 inches or more. Each interior wall 142 extends from the inner wall of the gas conduit 100 to an external wall of the internal leakage monitoring conduit 172. Note that each of the channels is in communication with the internal leakage monitoring conduit 172, such that a leak in any of the channels may be detected using the internal leakage monitoring conduit 172.

FIG. 4C shows an embodiment where a central portion of the gas conduit 100 serves as the gas channel 150, while the cooling channel 160 and the return channel 170 each occupy a portion of the outer annular ring that surrounds the gas channel 150. Again, the cross-sectional area of the three channels does not have to be equal. Further, the cross-section area of each channel may be similar to that described above with respect to FIG. 2A.

FIG. 4D shows an embodiment where a central portion of the gas conduit 100 serves as the gas channel 150, while the cooling channel 160 and the return channel 170 each occupy an annular ring that surrounds the gas channel 150. In some embodiments, the annular ring that serves as the cooling channel 160 is adjacent to the gas channel 150, while the return channel 170 is the outermost annular ring. Again, the cross-sectional area of the three channels does not have to be equal.

Of course, there are other arrangements of the three channels that may be used. In certain embodiments, the channels are arranged so that the cooling channel 160 is adjacent to the gas channel 150.

Figure 5A:
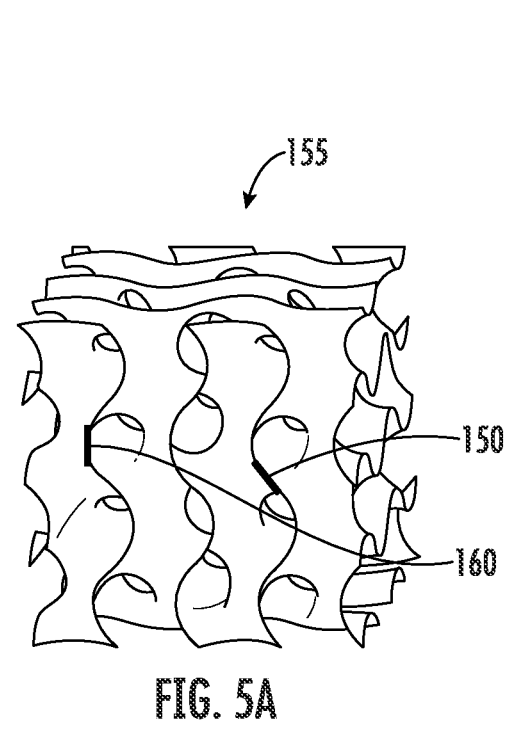
FIG. 5A shows a view of the interior of the gas conduit according to another embodiment.
Figure 5B:
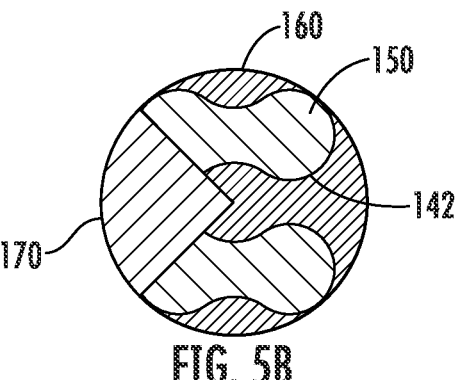
FIGS. 5B-5D show three different cross-sections of the gas conduit of FIG. 5A.
Figure 5C:
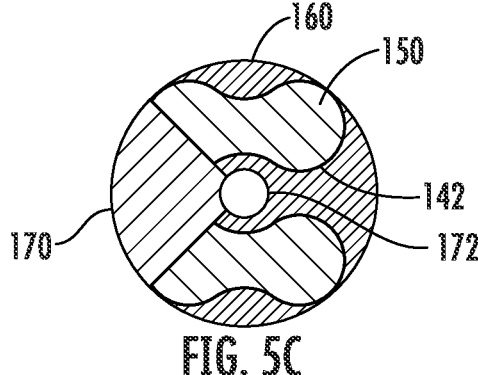
Figure 5D:
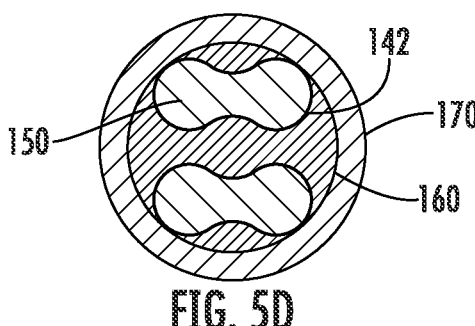

FIG. 5A shows another embodiment, wherein a portion of the interior of the gas conduit 100 is a lattice 155 in the form of a gyroid. A gyroid is defined as a "triply periodic minimal surfaces, meaning one that repeats itself in 3 different directions in space, like a crystal". By definition, the lattice 155 has two volumes/flow paths that never intersect which allows for an extremely high rate of heat exchange between the fluids passing through it. Thus, to maximize the cooling of the gas channel 150, the cooling channel 160 and the gas channel 150 are disposed in the lattice 155. FIGS. 5B-5D show different embodiments that incorporate the return channel 170. In FIG. 5B, interior walls 142 are used to define a wedge of the gas conduit that is reserved for the return channel 170. The wedge may be similar to that described in FIG. 4A. Alternatively, the portion of the cross-section used for the return channel 170 may be another shape. In FIG. 5C, an internal leakage monitoring conduit 172 may be disposed in the center of the gas conduit, similar to the embodiment shown in FIG. 4B. In FIG. 5D, an outer annular ring is used to provide the return channel 170. Note that the embodiment shown in FIG. 5D may be changed such that the return channel 170 is a central conduit and the lattice 155 is disposed around the return channel 170.

Note that for each of these embodiments, there is a junction 165 that is used to connect the cooling channel 160 and the return channel 170.

While FIGS. 2A-5D show one gas conduit 100 that includes three channels in close proximity to one another, such as within 0.1 inches, other embodiments are also possible. For example, as described above, cooling of the gas channel occurs when there is heat exchange with the cooling channel. Thus, in another embodiment, the cooling channel and the gas channel are adjacent to one another, while the return channel is physically separate from these two channels. For example, in one embodiment, shown in FIG. 6A, the cooling channel 120 and the gas channel 110 may be tubes that are bonded together, while the return channel 130 is a tube that is physically separate from the two bonded tubes. As before, a junction 125 is used to connect the cooling channel 120 and the return channel 130.

Additionally, this arrangement may also be utilized with additive manufacturing. For example, the gas conduit 100 may have a cross section with only two channels. This may be a central channel, which may be the gas channel 150, with a second channel as an annular ring, which may be the cooling channel 160. In another embodiment, an interior wall 142 may be used to separate the gas channel 150 from the cooling channel 160. In another embodiment, the interior of the gas conduit may be in the form of lattice 155. In these embodiments, the return channel 170 is disposed in a separate conduit that is physically separate from the gas conduit 100.

Figure 6A:
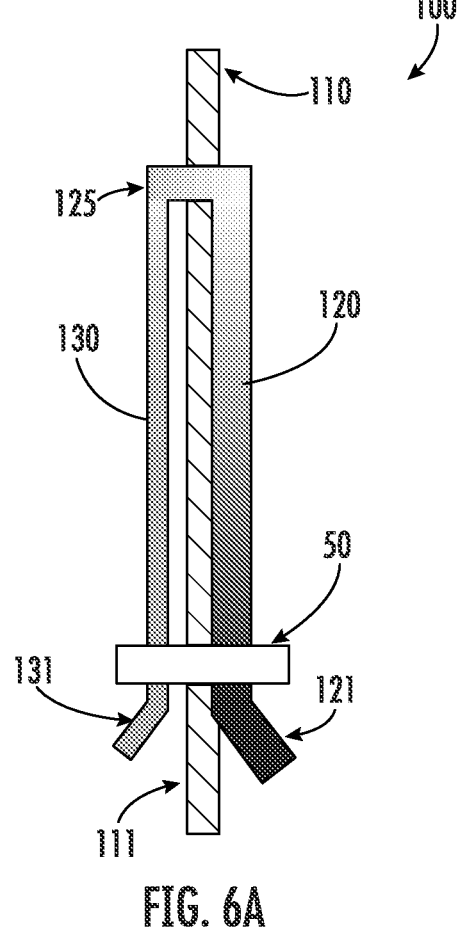
FIGS. 6A-6B show two additional embodiments of a gas conduit that actively cools the feed gas.
Figure 6B:
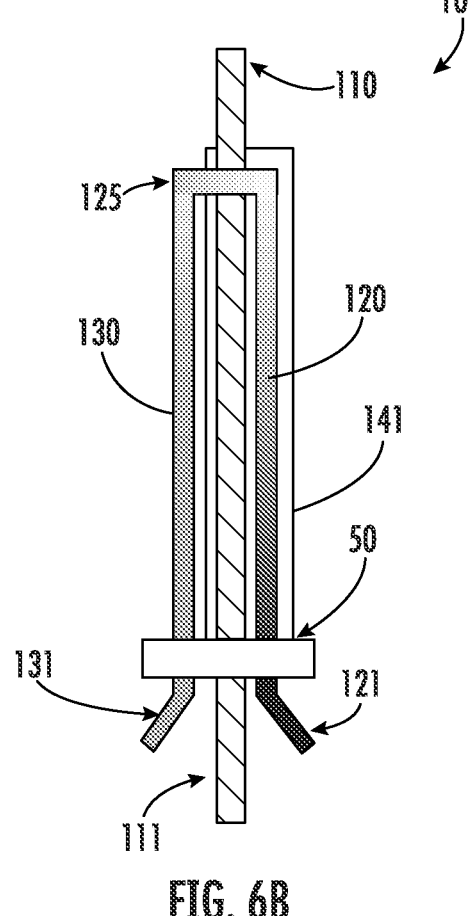

FIG. 6B shows another embodiment that utilizes traditional manufacturing techniques. This embodiment is similar to that shown in FIG. 2B, but the return channel 130 is physically separate from the block of material 141.

Again, in each of these embodiments, a junction is used to connect the cooling channel to the return channel. Because the return channel is physically separate from the gas conduit, a small section of pipe may be used to connect the cooling channel and the return channel.

The previous embodiments all introduce a cooling channel that is adjacent to and parallel to the gas channel for at least a portion of its length from the vacuum flange 50 to the gas bushing 30. In some embodiments, the cooling channel is parallel to the gas channel over a distance of at least 6 inches. In some embodiments, the cooling channel is adjacent to and parallel to the gas channel as it approaches the gas bushing 30. For example, in some embodiments, the cooling channel may be adjacent to the gas channel to within 6 inches of the gas bushing 30. In other embodiments, the cooling channel may be adjacent to the gas channel to within 4 inches of the gas bushing 30. In yet other embodiments, the cooling channel may be adjacent to the gas channel to within 2 inches of the gas bushing 30. In some embodiments, the cooling channel abuts the gas channel along at least a portion of its length from the vacuum flange 50 to the outlet 113, where it attaches to the gas bushing 30. In some embodiments, the portion is at least 50% of the length from the vacuum flange 50 to the outlet 113. In some embodiments, the portion is at least 75% of the length from the vacuum flange 50 to the outlet 113.

However, other embodiments are also possible. For example, as shown in FIG. 1, the base 20 contains base cooling channels 21. In some embodiments, these base cooling channels 21 may be utilized to cool the gas conduit.

Figures 7A, 7B:
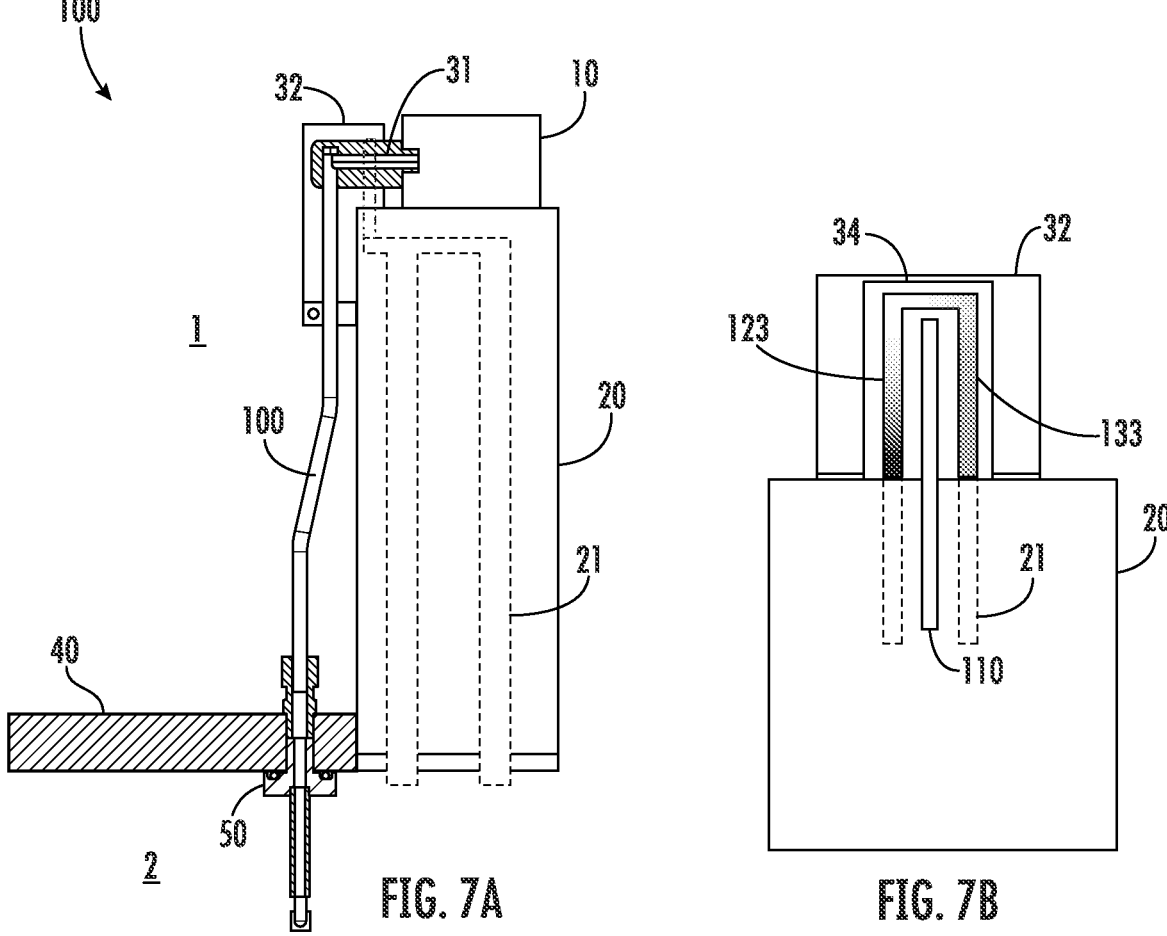
FIGS. 7A-7B show an embodiment of the gas bushing that includes active cooling.

FIG. 7A shows a side view of an embodiment that utilizes the base cooling channels 21 located in the base 20. FIG. 7B shows a front view of this embodiment. These base cooling channels 21 may be disposed throughout the base 20 and are used to carry a cooling fluid to maintain the base 20 at a predetermined temperature. In this embodiment, the gas bushing 32 is modified to allow the introduction of cooling fluid from the base 20. The gas bushing 32 may be a conductive material capable of withstanding the high temperatures in the region, such as graphite or a metal such as tungsten, tantalum or stainless steel. Alternatively, a nonporous ceramic material that does not interact with the feed gas may be used. The gas bushing 32, as is typical, includes a bushing conduit 31 that extends from the gas conduit 100 to the ion source 10. The gas bushing 32 also includes at least one pathway that has an inlet and an outlet, also referred to as a cooling loop 34. The inlet is in fluid communication with the internal cooling channel 123, while the outlet is in fluid communication with the internal return channel 133. As described above, the internal cooling channel 123 and the internal return channel 133 are connected such that cooling fluid can flow from the inlet, through the cooling loop 34 (i.e., the internal cooling channel 123 and the internal return channel 133) and exit through the outlet. The inlet and the outlet are each in communication with the base cooling channels 21 of the base 20. The cooling loop 34 may have a cross-sectional area that is similar to the cooling channel described above. Further, in this embodiment, the inlet and outlet of the cooling loop 34 of the gas bushing 32 are sealed to openings in the base 20, which correspond to the base cooling channels 21. For example, the gas bushing 32 may be bolted to the base 20 and O-rings or another compression seal may be used to seal the gas bushing 32 to the openings in the base 20. Further, the cooling loop 34 may be parallel to the bushing conduit 31 over at least a portion of its length.

Figure 8:
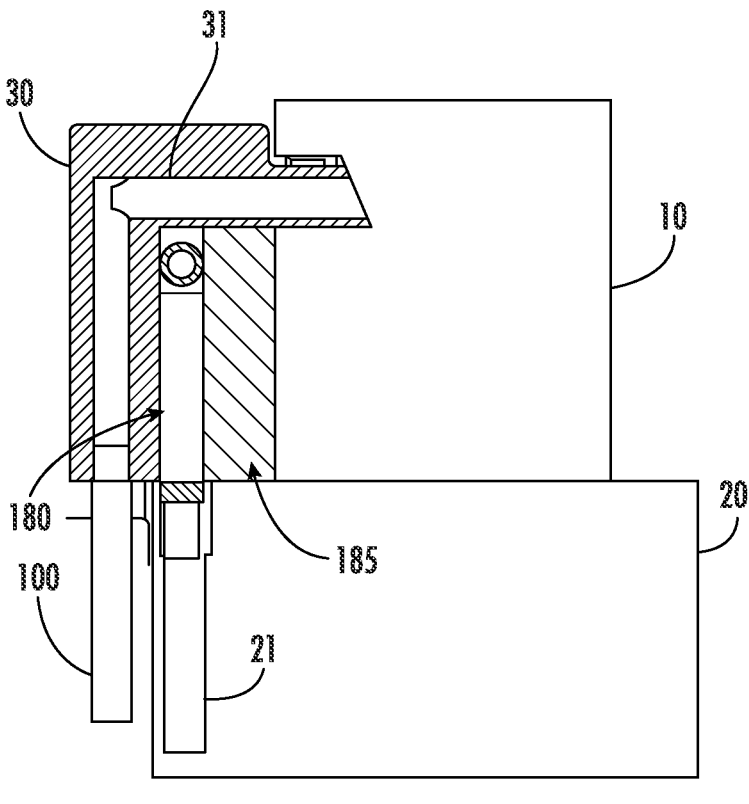
FIG. 8 shows an embodiment that uses a cooling loop connected to the base.

The base cooling channels 21 may be exploited in other ways as well. FIG. 8 shows another embodiment. In this embodiment, the gas conduit 100 simply contains the gas channel. A cooling loop 180 is attached to the base 20, in communication with the openings in the base that correspond to the base cooling channels 21, so that cooling fluid may flow from the base 20, through the cooling loop 180 and back into the base 20. The cooling loop 180 may be pressed against the gas bushing 30, such as by use of a clamping block 185. In some embodiments, the cooling loop 180 is welded to the base 20, such that there are no sealed connections in the vacuum chamber 1. In some embodiments, the cooling loop 180 is clamped to the gas bushing 30.

Figure 9:
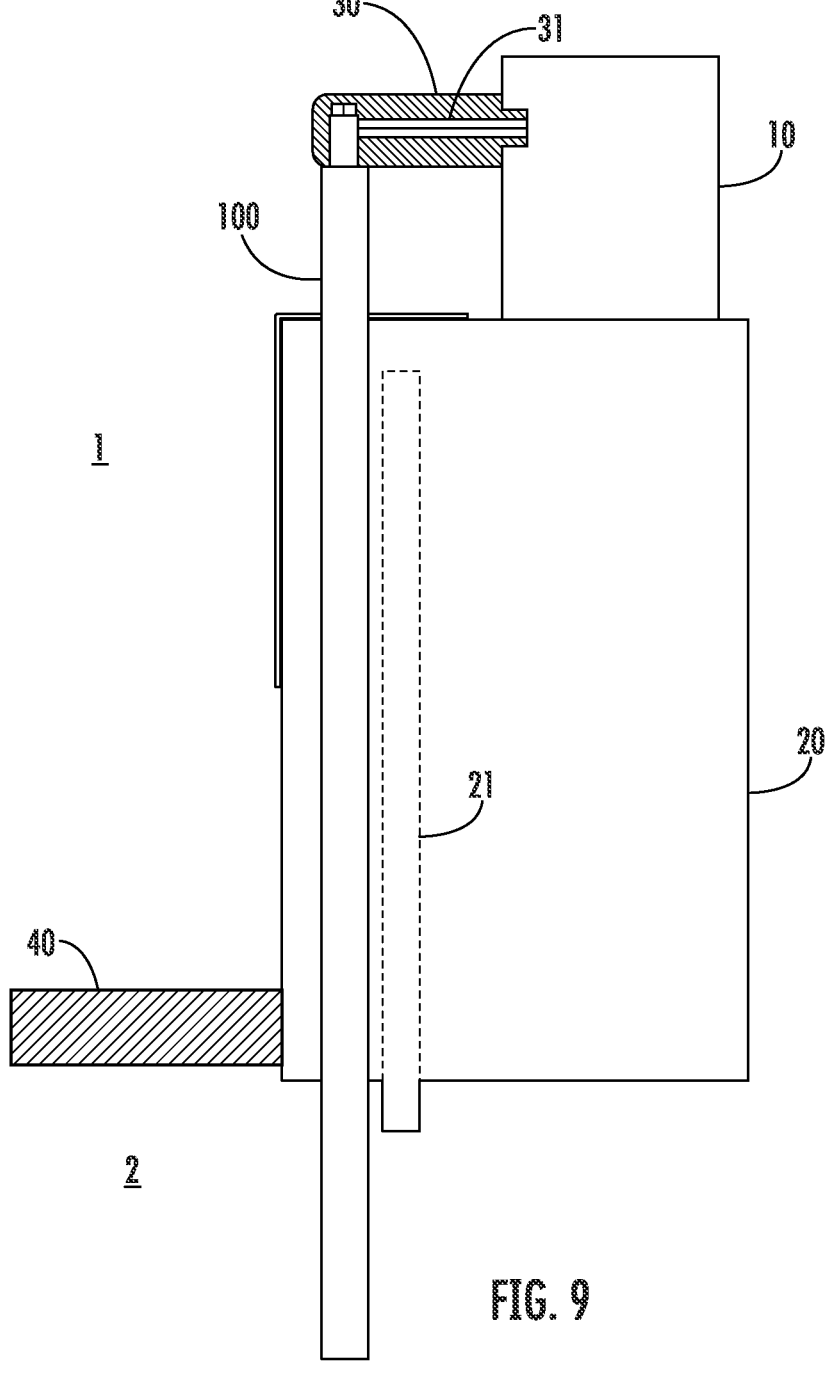
FIG. 9 shows an embodiment where the gas conduit passes through the base.

FIG. 9 shows another embodiment. In this embodiment, the base 20 is configured such that at least a portion of the gas conduit 100 passes through the base 20. For example, the base 20 may form part of the boundary between the vacuum chamber 1 and the atmospheric environment 2. The gas conduit 100 may enter the base 20 in the atmospheric environment 2 and travel through the base 20 toward the gas bushing 30. The gas conduit 100 then emerges from the base 20 and the exposed portion of the gas conduit 100 connects to the first end of the bushing conduit 31 of the gas bushing 30. Since the base 20 is maintained at a predetermined temperature, the gas conduit 100 is also maintained at this temperature as it passes through the base 20. Furthermore, in some embodiments, the base 20 is configured such that a base cooling channel 21 is disposed near the gas conduit 100. For example, the base cooling channel 21 may be within 0.05 inches to 1 inch of the gas conduit 100. In some embodiments, the gas conduit 100 is a separate tube that passes through the base 20. In other embodiments, the gas conduit 100 is machined into the base 20.

Figure 10A:
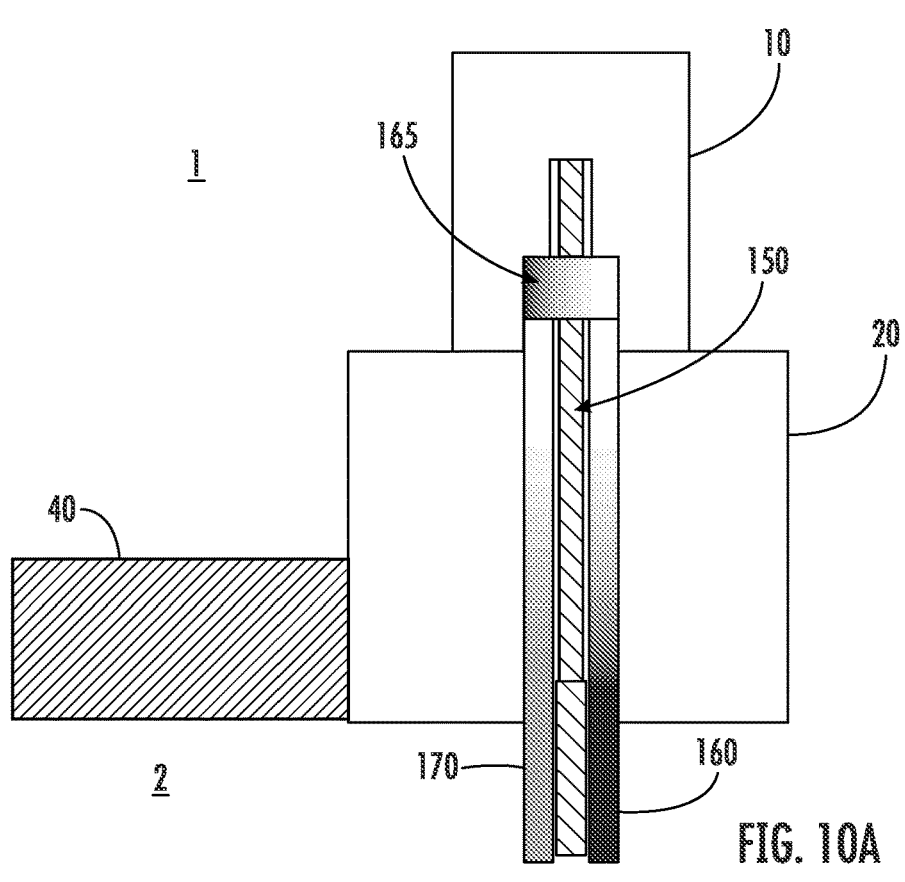
FIGS. 10A-10B show two embodiments where the gas conduit enters the ion source through a surface adjacent to the base.
Figure 10B:
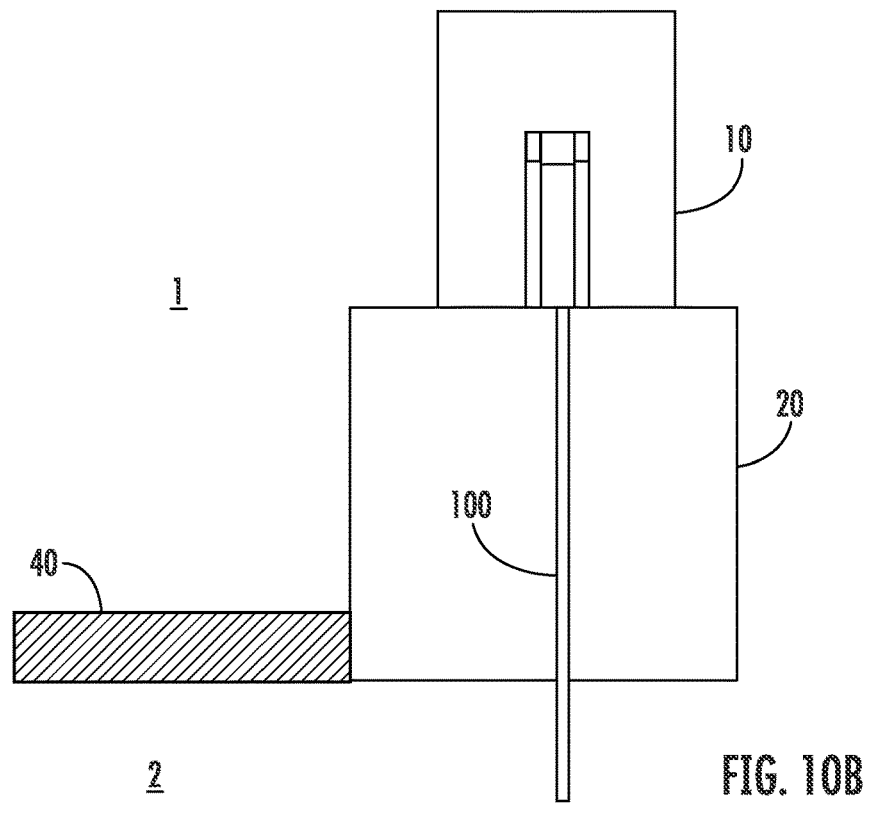

FIGS. 10A-10B show other embodiments in which the gas conduit 100 passes through the base 20, or a cavity in the base 20. In FIG. 10A, the gas conduit 100 includes the gas channel 150, the cooling channel 160 and return channel 170. This gas conduit 100 may be any of the embodiments shown in FIG. 2A-2B, 3A-3B, 4A-4D, or 5A-5D. This gas conduit 100 passes through the base 20 or the cavity and enters into the ion source 10 through a surface which is adjacent to the base 20. The inlet to the gas channel 150 and the cooling channel 160 are both disposed in the atmospheric environment 2. Further, a junction 165 is located in the gas conduit 100 to allow fluid communications between the cooling channel 160 and the return channel 170. In this way, only the gas conduit enters the ion source 10.

FIG. 10B shows another embodiment where the gas conduit 100 passes through the base 20. This gas conduit 100 passes through the base 20 and enters into the ion source 10 through a surface which is adjacent to the base 20. The inlet to the gas channel 150 is disposed in the atmospheric environment 2. As described above, the base 20 has one or more base cooling channels 21 disposed therein. The gas conduit 100 is cooled by virtue of its proximity to the base cooling channels 21.

The embodiments described above in the present application may have many advantages. As noted above, certain feed gas decompose at elevate temperatures. For example, certain gasses decompose at temperatures of 400° C. while others may decompose at temperatures as low as 300° C. By utilizing a cooling channel that is in proximity to the gas channel, the temperature of the feed gas may be maintained at a lower temperature. In one experiment, the maximum temperature of the walls of the gas channel may be reduced by more than 400° C. This allows these gasses that have lower decomposition temperatures to be utilized without clogging.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implantation system, comprising:
an ion source;
a gas bushing in communication with an interior of the ion source, wherein the ion source and the gas bushing are located in a vacuum chamber;
a vacuum flange to separate the vacuum chamber from an atmospheric environment; and
a gas conduit in communication with the gas bushing, comprising:
a gas channel having an inlet located in the atmospheric environment and an outlet in communication with the gas bushing;
a cooling channel adjacent to the gas channel; and
a return channel, in fluid communication with the cooling channel;
wherein the cooling channel abuts the gas channel along at least 50% of a length of the gas channel between the vacuum flange and the outlet.

2. The ion implantation system of claim 1, wherein the cooling channel abuts the gas channel as it passes through the vacuum flange.

3. The ion implantation system of claim 1, wherein the gas channel and the cooling channel are separate tubes that are bonded together.

4. The ion implantation system of claim 3, wherein the return channel is a separate tube that is bonded to the gas channel and the cooling channel.

5. The ion implantation system of claim 1, further comprising a block of material;
wherein the cooling channel and the gas channel are created by gun drilled bores in the block of material.

6. The ion implantation system of claim 5, wherein the return channel is created by a gun drilled bore in the block of material.

7. The ion implantation system of claim 1, wherein the cooling channel, the return channel and the gas channel are all disposed in one conduit, and interior walls are used to separate the channels.

8. The ion implantation system of claim 7, wherein the cooling channel, the return channel and the gas channel extend linearly through a length of the one conduit.

9. The ion implantation system of claim 7, wherein the cooling channel, the return channel and the gas channel spiral though a length of the one conduit.

10. An ion implantation system, comprising:
an ion source, wherein the ion source is located in a vacuum chamber;
a base on which the ion source is disposed;
a vacuum flange to separate the vacuum chamber from an atmospheric environment; and
a gas conduit in communication with the ion source, comprising:
a gas channel having an inlet located in the atmospheric environment and an outlet in communication with an interior of the ion source;
a cooling channel adjacent to the gas channel; and
a return channel, in fluid communication with the cooling channel;
wherein the cooling channel abuts the gas channel along at least 50% of a length of the gas channel between the vacuum flange and the outlet.

11. The ion implantation system of claim 10, wherein at least a portion of the gas conduit passes through the base.

12. An ion implantation system, comprising:
an ion source;
a base on which the ion source is disposed, the base including base cooling channels, the base having two openings in communication with the base cooling channels;
a cooling loop, external to the base, in communication with the two openings in the base;
a gas bushing in communication with an interior of the ion source, the gas bushing comprising a bushing conduit for carrying feed gas to the ion source; and
a gas conduit in communication with a first end of the bushing conduit;
wherein fluid passing through the base cooling channels enters to the cooling loop, cools the bushing conduit and returns to the base cooling channels.

13. The ion implantation system of claim 12, wherein the cooling loop is pressed against the gas bushing.

14. The ion implantation system of claim 12, wherein the cooling loop is parallel to the bushing conduit for at least a portion of its length.

* * * * *